(12) United States Patent
Nagaoka et al.

(10) Patent No.: US 11,280,023 B2
(45) Date of Patent: Mar. 22, 2022

(54) FILM FORMATION APPARATUS AND METHOD OF MANUFACTURING SEMICONDUCTOR DEVICE

(71) Applicants: Tatsuji Nagaoka, Nagakute (JP); Hiroyuki Nishinaka, Kyoto (JP); Daisuke Tahara, Kyoto (JP); Masahiro Yoshimoto, Kyoto (JP)

(72) Inventors: Tatsuji Nagaoka, Nagakute (JP); Hiroyuki Nishinaka, Kyoto (JP); Daisuke Tahara, Kyoto (JP); Masahiro Yoshimoto, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 35 days.

(21) Appl. No.: 16/736,886

(22) Filed: Jan. 8, 2020

(65) Prior Publication Data
US 2020/0240038 A1 Jul. 30, 2020

(30) Foreign Application Priority Data

Jan. 25, 2019 (JP) .............................. JP2019-011157

(51) Int. Cl.
*C30B 23/02* (2006.01)
*C30B 7/00* (2006.01)
(Continued)

(52) U.S. Cl.
CPC ................ *C30B 7/005* (2013.01); *C30B 7/04* (2013.01); *C30B 7/14* (2013.01); *C30B 19/066* (2013.01);
(Continued)

(58) Field of Classification Search
CPC ......... C30B 23/02; C30B 23/06; C30B 25/02; C30B 25/18; C30B 35/005
See application file for complete search history.

(56) References Cited

U.S. PATENT DOCUMENTS

| 5,451,260 A * | 9/1995 | Versteeg ............. C23C 16/4486 118/725 |
| 2003/0080325 A1* | 5/2003 | Uchiyama ......... H01L 21/02205 252/500 |
| 2017/0278706 A1* | 9/2017 | Oda ................... H01L 29/66969 |

FOREIGN PATENT DOCUMENTS

| JP | 2003240437 A | 8/2003 |
| JP | 2007077436 A | 3/2007 |

(Continued)

OTHER PUBLICATIONS

Kim et al. "Optical properties of b ga2O3 and Ga2O3:Co thin films grown by spray pyrolysis" J of Applied Physics 62 (5) Sep. 1987 pp. 2000-2002.*

*Primary Examiner* — Robert M Kunemund
(74) *Attorney, Agent, or Firm* — Sughrue Mion, PLLC

(57) ABSTRACT

A film formation apparatus is configured to epitaxially grow a film on a surface of a substrate, and the film formation apparatus may include: a stage configured to allow the substrate to be mounted thereon; a heater configured to heat the substrate; a mist supply source configured to supply mist of a solution that comprises a solvent and a material of the film dissolved in the solvent; a heated-gas supply source configured to supply heated gas that comprises gas constituted of a same material as a material of the solvent and has a higher temperature than the mist; and a delivery device configured to deliver the mist and the heated gas to the surface of the substrate.

11 Claims, 11 Drawing Sheets

(51) Int. Cl.
*C30B 7/04* (2006.01)
*C30B 7/14* (2006.01)
*H01L 21/02* (2006.01)
*C30B 19/06* (2006.01)
*C30B 29/16* (2006.01)
*C30B 19/08* (2006.01)

(52) U.S. Cl.
CPC .............. *C30B 19/08* (2013.01); *C30B 29/16* (2013.01); *H01L 21/02565* (2013.01); *H01L 21/02628* (2013.01)

(56) References Cited

FOREIGN PATENT DOCUMENTS

| | | |
|---|---|---|
| JP | 2015-070248 A | 4/2015 |
| WO | 2011093274 A1 | 8/2011 |

* cited by examiner

FILM FORMATION APPARATUS AND METHOD OF MANUFACTURING SEMICONDUCTOR DEVICE

CROSS-REFERENCE TO RELATED APPLICATION

This application claims priority to Japanese Patent Application No. 2019-011157 filed on Jan. 25, 2019, the contents of which are hereby incorporated by reference into the present application.

TECHNICAL FIELD

The technology disclosed herein relates to a film formation apparatus and a method of manufacturing a semiconductor device.

BACKGROUND

Japanese Patent Application Publication No. 2015-070248 describes a film formation apparatus configured to grow a film on a surface of a substrate. This film formation apparatus includes a stage configured to allow the substrate to be mounted thereon, a heater configured to heat the substrate, a mist supply source configured to supply mist of a solution that contains solvent and a material of the film dissolved in the solvent, and a delivery device configured to deliver the mist to the surface of the substrate. The mist adheres to the surface of the heated substrate, and thus the film is grown on the surface of the substrate.

SUMMARY

As mentioned above, in the film formation apparatus in Japanese Patent Application Publication No. 2015-070248, the mist adheres to the surface of the heated substrate, by which the film grows on the surface of the substrate. The mist has a lower temperature than the substrate, and hence heat is removed from the substrate when the mist is adhering to the substrate. This destabilizes a temperature of the substrate and causes difficulty in growing a film with stable quality. A possible measure to address this is to supply heated mist to the surface of the substrate. In this case, there is however a problem where, while the mist is being delivered to the surface of the substrate, the solvent evaporates from the mist, and the solution constituting the mist changes in concentration. The present specification proposes a technology of growing a film with stable quality on a surface of a substrate by using mist.

A film formation apparatus disclosed herein is configured to epitaxially grow a film on a surface of a substrate. The film formation apparatus may comprise: a stage configured to allow the substrate to be mounted thereon; a heater configured to heat the substrate; a mist supply source configured to supply mist of a solution that comprises solvent and a material of the film dissolved in the solvent; a heated-gas supply source configured to supply heated gas that comprises gas constituted of a same material as a material of the solvent and has a higher temperature than the mist; and a delivery device configured to deliver the mist and the heated gas toward the surface of the substrate.

In this film formation apparatus, the heated-gas supply source supplies the heated gas that has a higher temperature than the mist. Due to this, when the mist and the heated gas are delivered to the surface of the substrate, the mist is heated by the heated gas. Since the heated mist is supplied to the surface of the substrate, the mist is less prone to remove heat from the substrate. Moreover, the heated gas contains the gas constituted of a same material as a material of the solvent. For example, if the solvent is water ($H_2O$), the heated gas contains water vapor. Due to this, in the heated gas, the gas constituted of the same material as the material of the solvent has a high partial pressure. Therefore, even if the mist is heated by the heated gas, the solvent contained in the mist is less prone to evaporate. This suppresses evaporation of the solvent from the mist, and the solution constituting the mist is less likely to change in concentration. Accordingly, the mist constituted of the solution of an appropriate concentration can be supplied to the surface of the substrate. Therefore, this film formation apparatus enables a film with stable quality to be epitaxially grown on the surface of the substrate.

DETAILED DESCRIPTION

First Embodiment

Figure 1:
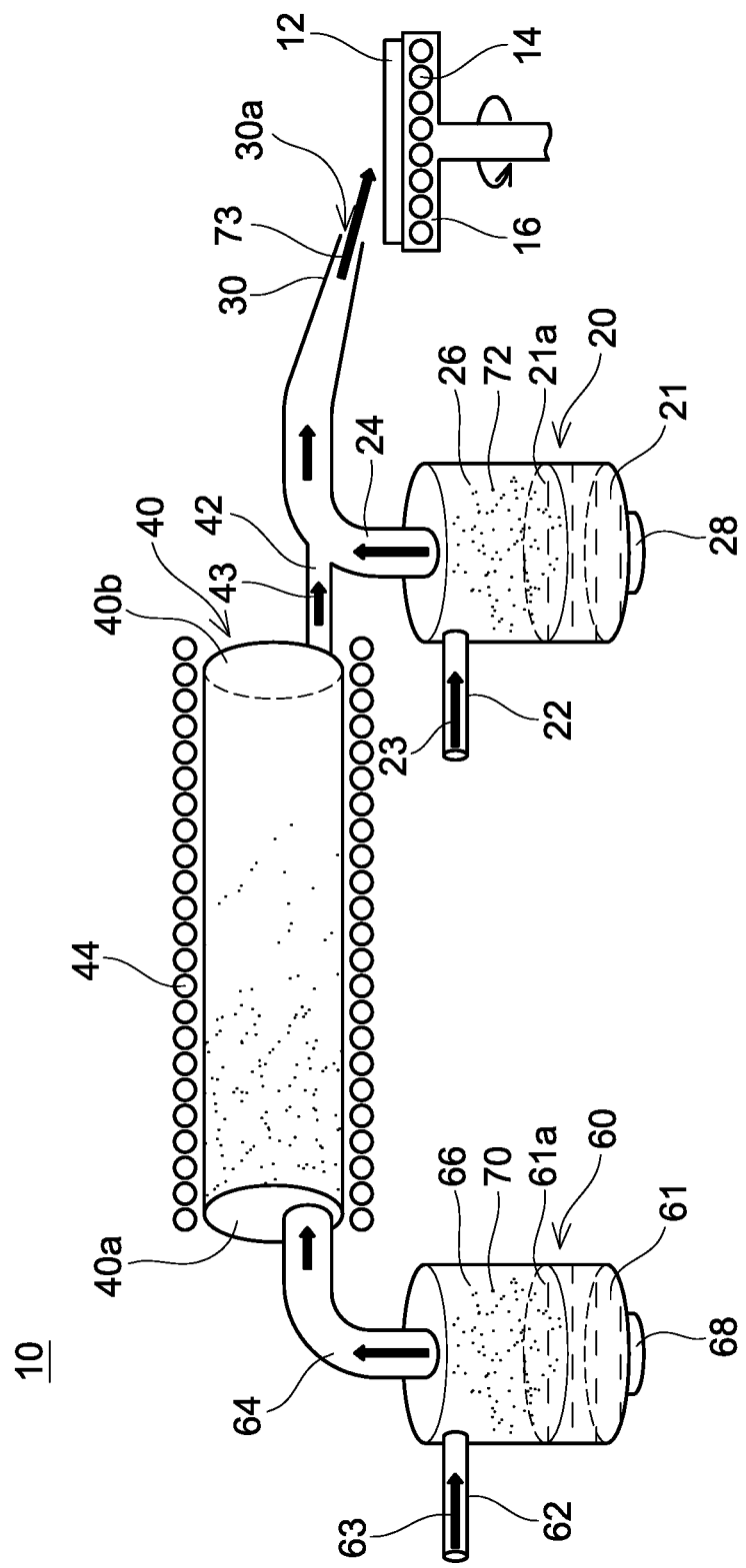
FIG. 1 is a configuration diagram of a film formation apparatus in a first embodiment.

A film formation apparatus 10 shown in FIG. 1 is an apparatus configured to epitaxially grow a film on a surface of a substrate 12. The film formation apparatus 10 is used for manufacturing a semiconductor device that comprises an epitaxially-grown film. The film formation apparatus 10 comprises a first reservoir 60, a furnace 40, a second reservoir 20, a nozzle 30, and a susceptor 16.

The susceptor 16 has a flat upper surface horizontally located. The susceptor 16 is configured to allow the substrate 12 to be mounted thereon. An upper surface of the substrate 12, which is mounted on the susceptor 16, is horizontally located. The susceptor 16 incorporates a heater 14 therein. The heater 14 heats the substrate 12. The susceptor 16 is rotatable about its central shaft. The rotation of the susceptor 16 rotates the substrate 12 on the susceptor 16 within its plane.

The first reservoir 60 is an enclosed container. The first reservoir 60 is configured to store water (more specifically, pure water ($H_2O$)) 61 therein. A space 66 is provided between a surface 61a of the water 61 and an upper surface of the first reservoir 60. An ultrasonic transducer 68 is installed at a bottom surface of the first reservoir 60. The ultrasonic transducer 68 is configured to apply ultrasound to the water 61 in the first reservoir 60. When ultrasound is applied to the water 61, the surface 61a of the water 61 vibrates, by which mist of the water 61 (hereinafter termed water mist 70) is generated in the space 66 above the water 61. The upper surface of the first reservoir 60 is connected to an upstream end of a water mist supply path 64. An upper portion of a peripheral wall of the first reservoir 60 is connected to a downstream end of a carrier gas supply path 62. An upstream end of the carrier gas supply path 62 is connected to a carrier gas supply source not shown. The carrier gas supply path 62 is configured to introduce carrier gas 63 from the carrier gas supply source to the space 66 in the first reservoir 60. The carrier gas 63 is, for example, inert gas such as nitrogen. The carrier gas 63 that has been introduced into the space 66 from the carrier gas supply path 62 flows from the space 66 to the water mist supply path 64. At this occasion, the water mist 70 in the space 66, together with the carrier gas 63, flows to the water mist supply path 64.

The furnace 40 is a tubular furnace extending from an upstream end 40a to a downstream end 40b. A heater 44 is arranged outside the furnace 40. The heater 44 is a heater using electrically heated wire, and is disposed along a peripheral wall of the furnace 40. The heater 44 heats the peripheral wall of the furnace 40, thereby heating an inside of the furnace 40. The upstream end 40a of the furnace 40 is connected to a downstream end of the water mist supply path 64. The downstream end 40b of the furnace 40 is connected to an upstream end of a heated-gas supply path 42. The water mist 70 and the carrier gas 63 are introduced from the water mist supply path 64 into the furnace 40. The water mist 70 and the carrier gas 63 flow through the furnace 40 from its upstream end 40a to its downstream end 40b. The water mist 70 and the carrier gas 63 are heated in the furnace 40. While flowing in the furnace 40, the water mist 70 evaporates and turns into water vapor. As a result, gas (hereinafter termed heated gas 43) which is a mixture of the water vapor and the carrier gas 63 is generated in the furnace 40. The heated gas 43 flows from the furnace 40 to the heated-gas supply path 42.

The second reservoir 20 is an enclosed container. The second reservoir 20 stores a solution 21 which contains water ($H_2O$) and a raw material of a film to be epitaxially grown on the surface of the substrate 12 dissolved in the water. For example, if a gallium oxide ($Ga_2O_3$) film is to be epitaxially grown, a solution which contains water and gallium dissolved in the water can be used as the solution 21. Moreover, the solution 21 may allow a raw material for adding an n-type or p-type dopant to the gallium oxide film (e.g., ammonium fluoride or the like) to be further dissolved therein. Moreover, the solution 21 may contain hydrochloric acid. A space 26 is provided between a surface 21a of the solution 21 and an upper surface of the second reservoir 20. An ultrasonic transducer 28 is installed at a bottom surface of the second reservoir 20. The ultrasonic transducer 28 is configured to apply ultrasound to the solution 21 stored in the second reservoir 20. When ultrasound is applied to the solution 21, the surface 21a of the solution 21 vibrates, thereby generating mist of the solution 21 (hereinafter termed solution mist 72) in the space 26 above the solution 21. The upper surface of the second reservoir 20 is connected to an upstream end of a solution mist supply path 24. An upper portion of an peripheral wall of the second reservoir 20 is connected to a downstream end of a carrier gas supply path 22. An upstream end of the carrier gas supply path 22 is connected to a carrier gas supply source not shown. The carrier gas supply path 22 is configured to introduce carrier gas 23 from the carrier gas supply source to the space 26 in the second reservoir 20. The carrier gas 23 is, for example, inert gas such as nitrogen. The carrier gas 23 that has been introduced into the space 26 from the carrier gas supply path 22 flows from the space 26 to the solution mist supply path 24. At this occasion, the solution mist 72 in the space 26, together with the carrier gas 23, flows to the solution mist supply path 24.

A downstream end of the heated-gas supply path 42 and a downstream end of the solution mist supply path 24 merge and connect to the nozzle 30. The heated gas 43 flows from the heated-gas supply path 42 to the nozzle 30, and the solution mist 72 flows from the solution mist supply path 24 to the nozzle 30. The heated gas 43 and the solution mist 72 mix with each other in the nozzle 30. This dilutes the solution mist 72. The heated gas 43 mixed with the solution mist 72 will hereinafter be termed a mixture 73. Since the heated gas 43 has been heated in the furnace 40, the heated gas 43 has a higher temperature than the solution mist 72. Accordingly, when the heated gas 43 and the solution mist 72 mix with each other, the temperature of the solution mist 72 increases. This causes evaporation of the water, which is its solvent, from the solution mist 72. In the present embodiment, however, the evaporation of water from the solution mist 72 is suppressed. That is, the heated gas 43 contains water vapor as mentioned before. Thus, the water vapor has a high partial pressure in the mixture 73 of the heated gas 43 and the solution mist 72. This suppresses the evaporation of water from the solution mist 72. An increase in concentration of the solution 21, which constitutes each droplet of the solution mist 72, is thus suppressed inside the nozzle 30. This enables the temperature of the solution mist 72 to increase while suppressing the increase in concentration of the solution 21, which constitutes each droplet of the solution mist 72. The nozzle 30 includes a discharge port 30*a*. The mixture 73 in the nozzle 30 is discharged from the discharge port 30*a*. The discharge port 30*a* is located in such an orientation as to be directed to the upper surface of the substrate 12 mounted on the susceptor 16. The mixture 73 is thus discharged from the discharge port 30*a* to the upper surface of the substrate 12.

Next, a film formation method using the film formation apparatus 10 will be described. Here, a semiconductor substrate constituted of a single crystal of β-gallium oxide (β-$Ga_2O_3$) is used as the substrate 12. Moreover, an aqueous solution which contains water and gallium chloride ($GaCl_3$, $Ga_2Cl_6$) dissolved in the water is used as the solution 21. Moreover, nitrogen gas is used as the carrier gas 23, 63.

Initially, the substrate 12 is installed on the susceptor 16. Next, the susceptor 16 is rotated, and the substrate 12 is heated by the heater 14. When the temperature of the substrate 12 has stabilized, the ultrasonic transducer 68 is operated so as to generate the water mist 70 in the space 66 in the first reservoir 60. Furthermore, the carrier gas 63 is introduced from the carrier gas supply path 62 into the first reservoir 60. The water mist 70 then flows through the water mist supply path 64 into the furnace 40, where the heated gas 43 (i.e., mixed gas of water vapor and the carrier gas 63) is generated. The heated gas 43 flows through the heated-gas supply path 42 into the nozzle 30. Moreover, substantially simultaneously with the activation of the ultrasonic transducer 68, the ultrasonic transducer 28 is activated. The solution mist 72 is thereby generated in the space 26 in the second reservoir 20. Furthermore, the carrier gas 23 is introduced from the carrier gas supply path 22 into the second reservoir 20. The solution mist 72 then flows through the solution mist supply path 24 into the nozzle 30. Within the nozzle 30, the solution mist 72 and the heated gas 43 mix with each other, and the mixture 73 is discharged from the discharge port 30a toward the upper surface of the substrate 12. The mixture 73 is discharged to the upper surface of the substrate 12, and the solution mist 72 adheres to the upper surface of the heated substrate 12 accordingly. The substrate 12 has a higher temperature than the solution mist 72, and thus a chemical reaction of the solution mist 72 (i.e., the solution 21) occurs on the substrate 12. As a result of this, β-gallium oxide (β-$Ga_2O_3$) is generated on the substrate 12. Because the solution mist 72 is continuously supplied to the surface of the substrate 12, a gallium oxide film is grown on the upper surface of the substrate 12. A single-crystal gallium oxide film is epitaxially grown on the surface of the substrate 12. If the solution 21 contains a raw material of a dopant, the dopant is captured into the gallium oxide film. For example, if the solution 21 contains ammonium fluoride ($NH_4F$), a gallium oxide film doped with fluorine is formed.

When adhering to the substrate 12, the solution mist 72 removes heat from the substrate 12. If the removal of heat causes the temperature of the substrate 12 to be unstable or to decrease the temperature of the upper surface of the substrate 12, a gallium oxide film cannot be epitaxially grown suitably on the upper surface of the substrate 12. Contrary to this, in the film formation apparatus 10 in the first embodiment, since the solution mist 72 is heated by the heated gas 43, the solution mist 72 is less prone to remove heat from the substrate 12 when adhering to the substrate 12. Accordingly, the substrate 12 can be maintained stably at an appropriate temperature. Moreover, since the heated gas 43 contains water vapor, water (i.e., the solvent) is less likely to evaporate from the solution mist 72 when the solution mist 72 is heated. This can avoid increase in concentration of the solution 21, which constitutes each droplet of the solution mist 72. The solution 21 of a suitable concentration can be supplied as the solution mist 72 to the upper surface of the substrate 12. As such, the film formation apparatus 10 in the first embodiment enables supply of the solution mist 72 constituted of the solution 21 of a suitable concentration to the surface of the substrate 12 while keeping the substrate 12 at a suitable temperature. Therefore, a gallium oxide film can be epitaxially grown suitably on the upper surface of the substrate 12.

Figure 2:
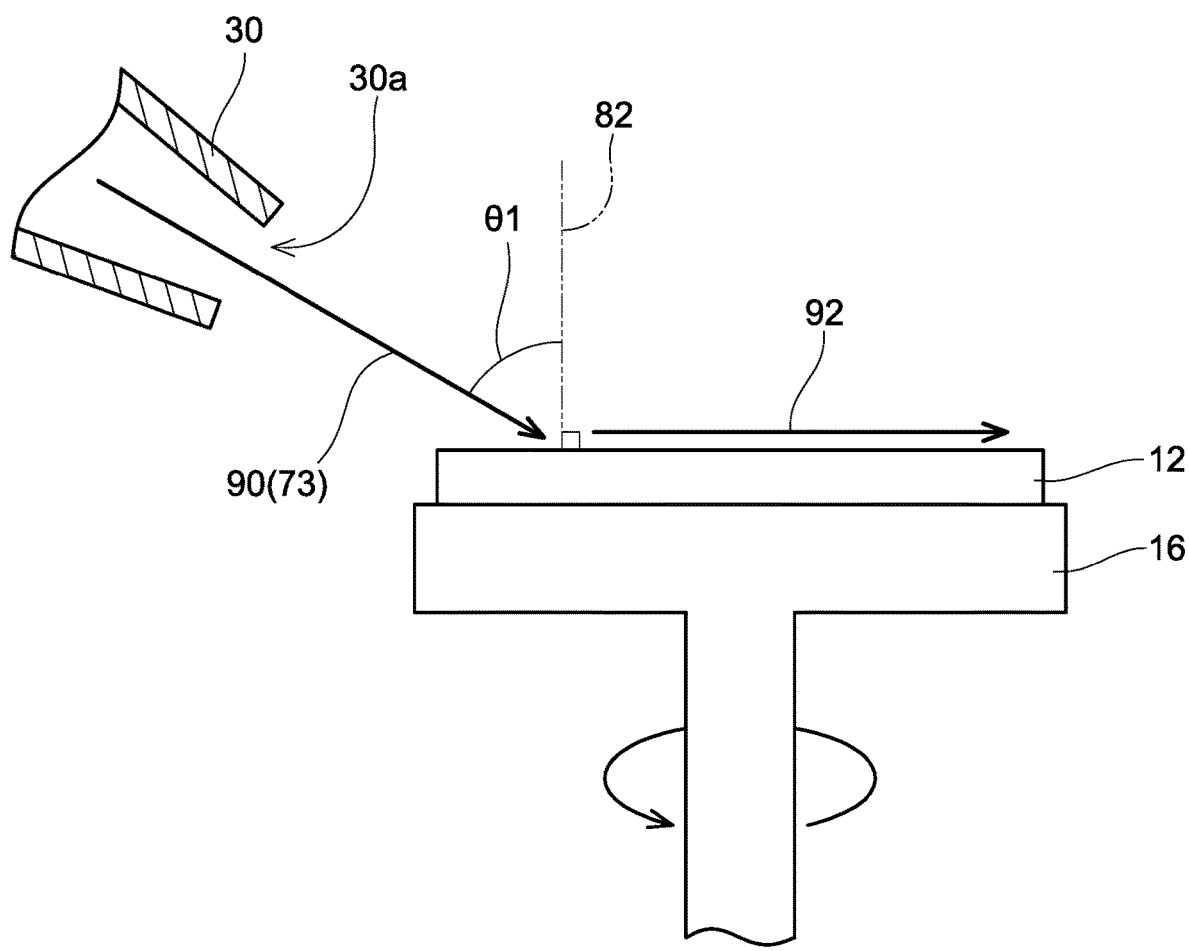
FIG. 2 is an enlarged view of a nozzle and a substrate in the first embodiment.

FIG. 2 shows an enlarged view of the nozzle 30 and the substrate 12. An arrow 90 in FIG. 2 shows a direction along which the mixture 73 is discharged from the discharge port 30a of the nozzle 30. The discharge direction 90 is inclined with respect to the upper surface of the substrate 12. An angle between a perpendicular line 82 standing on the upper surface of the substrate 12 and the discharge direction will hereinafter be termed an inclination angle (i.e. an inclination angle with respect to the upper surface of the substrate). An inclination angle θ1 of the discharge direction 90 is more than 45 degrees. As such, increasing the inclination angle θ1 of the discharge direction 90 allows the mixture 73 discharged toward the upper surface of the substrate 12 to flow smoothly along the upper surface of the substrate 12 as shown by an arrow 92. This enables a gallium oxide film to be epitaxially grown uniformly in a wide range of the upper surface of the substrate 12.

Moreover, as mentioned above, the susceptor 16 rotates the substrate 12 within its plane. This enables the mixture 73 to be supplied to an entirety of the upper surface of the substrate 12, and enables a gallium oxide film to be epitaxially grown uniformly on the entirety of the upper surface of the substrate 12. Moreover, the susceptor 16 rotates the substrate 12 at such a low speed that a moving speed at a position where a moving speed of the substrate 12 is highest (i.e., a peripheral edge of the substrate 12) becomes lower than a flow speed of the mixture 73 (i.e., the solution mist 72) discharged from the discharge port 30a toward the upper surface of the substrate 12. Accordingly, a flow of gas due to the rotation of the substrate 12 is less likely to occur, and a flow of the mixture 73 is less likely to become turbulent near the substrate 12. Therefore, a gallium oxide film can be grown suitably.

Second Embodiment

Figure 3:
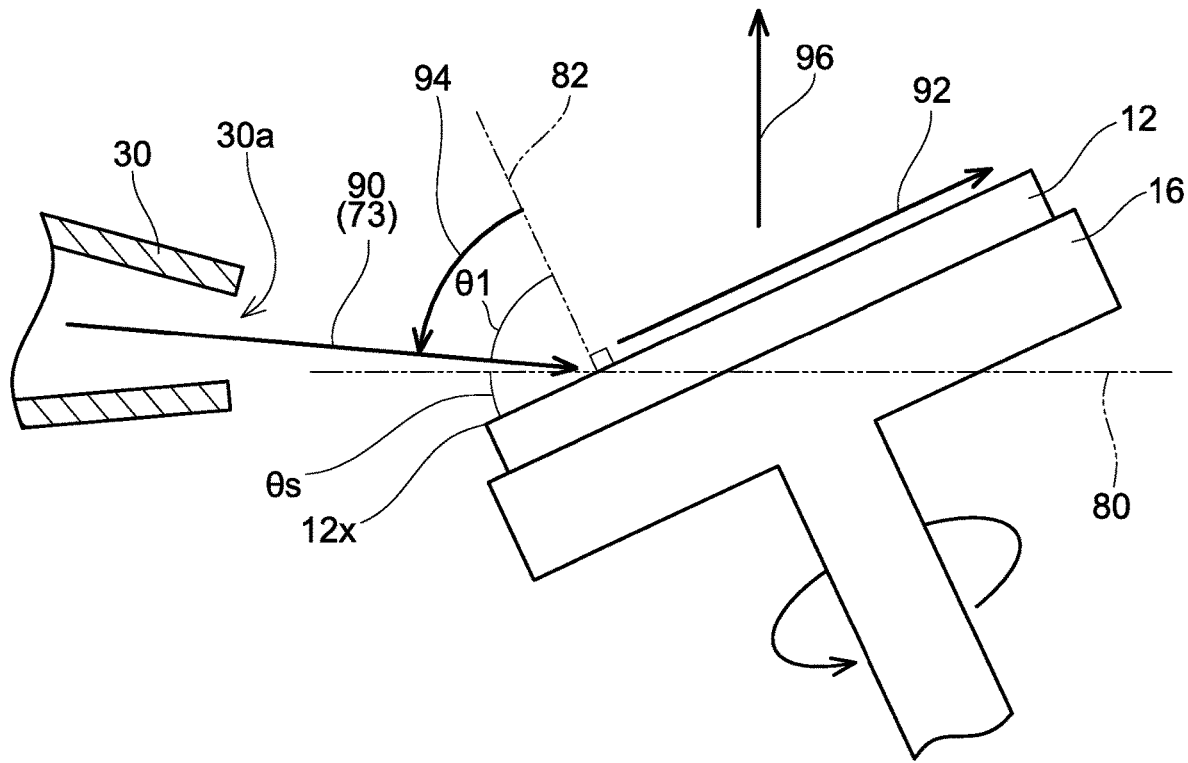
FIG. 3 is an enlarged view of a nozzle and a substrate in a second embodiment.

A film formation apparatus in a second embodiment, shown in FIG. 3, differs from that in the first embodiment in how the susceptor 16 and the nozzle 30 are positioned. Other configurations of the film formation apparatus in the second embodiment are equal to those in the first embodiment. In the second embodiment, the susceptor 16 is inclined with respect to a horizontal plane 80. Accordingly, the upper surface of the substrate 12 mounted on the susceptor 16 is also inclined with respect to the horizontal plane 80. In FIG. 3, an inclination angle θs shows an inclination angle of the upper surface of the substrate 12 with respect to the horizontal plane 80 (i.e., an angle between the upper surface of the substrate 12 and the horizontal plane 80). Moreover, as shown by an arrow 94, the discharge direction 90 of the mixture 73 (i.e., the solution mist 72) is inclined toward a lower edge 12x of the upper surface of the substrate 12 from the perpendicular line 82 standing on the upper surface of the substrate 12. The inclination angle θ1 of the discharge direction 90 with respect to the upper surface of the substrate 12 is equal to or more than 45 degrees. A sum of the inclination angle θ1 and the inclination angle θs is less than 90 degrees.

When the solution mist 72 adheres to the upper surface of the substrate 12, water evaporates from the solution mist 72 (i.e., the solution 21). The water that has evaporated (i.e., water vapor) attempts to move mainly upward as shown by an arrow 96 in FIG. 3. If, as in FIG. 3, the upper surface of the substrate 12 inclines with respect to the horizontal plane 80, and the discharge direction 90 inclines to the lower edge 12x side of the upper surface of the substrate 12 with respect to the upper surface of the substrate 12, an angle between the discharge direction 90 and a traveling direction of the water vapor shown by the arrow 96 increases. Due to this, a flow of the discharged mixture 73 (i.e., the discharge direction 90) and a flow of the water vapor (i.e., the arrow 96) are thus less likely to interfere with each other. Therefore, as shown by an arrow 92, the solution mist 72 easily flows along the upper surface of the substrate 12, and a gallium oxide film can be grown more suitably on the upper surface of the substrate 12.

Third Embodiment

Figure 4:
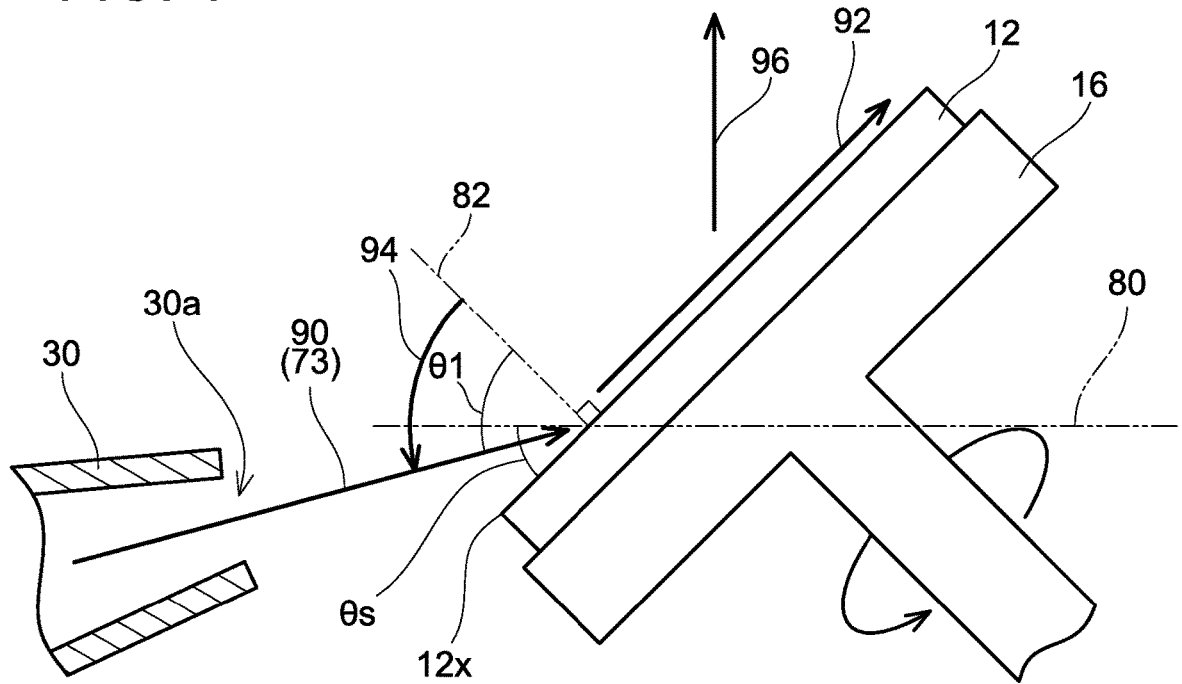
FIG. 4 is an enlarged view of a nozzle and a substrate in a third embodiment.

A film formation apparatus in a third embodiment, shown in FIG. 4, differs from that in the second embodiment about inclination angles of the nozzle 30 and the susceptor 16. Other configurations of the film formation apparatus in the third embodiment are equal to those in the second embodiment. In the third embodiment, an inclination angle θs of the susceptor 16 is larger than that in the second embodiment. In the third embodiment, as in the second embodiment, the discharge direction 90 is inclined, as shown by an arrow 94, to the lower edge 12x side of the upper surface of the substrate 12 from a perpendicular line 82 standing on the upper surface of the substrate 12. An inclination angle θ1 of the discharge direction 90 is equal to or more than 45 degrees. In the third embodiment, the sum of the inclination angle θ1 and the inclination angle θs is equal to or more than 90 degrees. Due to this, in the third embodiment, the discharge direction 90 is oriented diagonally upward. This configuration further increases the angle between the discharge direction 90 and the traveling direction of the water vapor shown by the arrow 96 than that in the second embodiment (FIG. 3), by which the flow of the mixture 73 (i.e., the discharge direction 90) and the flow of water vapor (i.e., the arrow 96) are even less likely to interfere with each other. Therefore, as shown by the arrow 92, the solution mist 72 further easily flows along the upper surface of the substrate 12, and a gallium oxide film can be grown further suitably on the upper surface of the substrate 12.

Note that in the above-mentioned first to three embodiments, the substrate 12 (i.e., the susceptor 16) may not be rotated. Alternatively, the substrate 12 may be rotated at a high speed such that the moving speed at a position where the moving speed of the substrate 12 (e.g., the peripheral edge of the substrate 12) is highest becomes higher than the flow speed of the solution mist 72 discharged from the discharge port 30a. Rotating the substrate 12 at a high speed causes a gas flow that is laminar along the upper surface of the substrate 12, and enables the solution mist 72 to flow along the laminar flow. This enables a gallium oxide film to be grown uniformly on the upper surface of the substrate 12.

Fourth Embodiment

Figure 5:
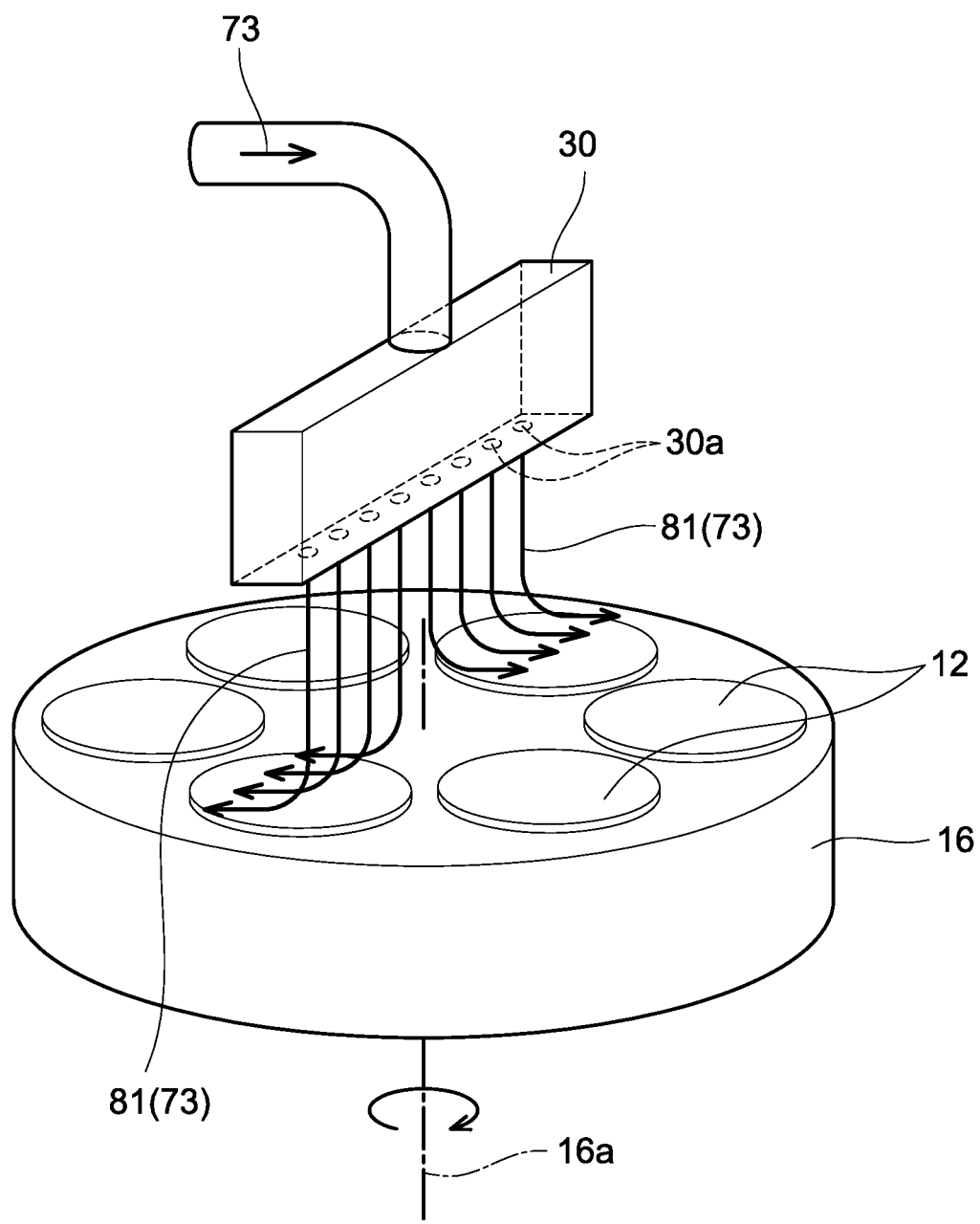
FIG. 5 is an enlarged view of a nozzle and substrates in a fourth embodiment.

In a film formation apparatus in a fourth embodiment shown in FIG. 5, a nozzle 30 has a rectangular parallelepiped shape that is elongated in one direction. A lower surface of the nozzle 30 is provided with a plurality of discharge ports 30a arranged in line. Moreover, the film formation apparatus in the fourth embodiment allows a plurality of substrates 12 to be mounted on a susceptor 16. The substrates 12 are distributed around a central axis 16a of the susceptor 16. As shown by arrows 81, the mixture 73 discharged downward from the nozzle 30 is able to impinge on an entirety of a diameter of the susceptor 16. This film formation apparatus rotates the susceptor 16 about the central axis 16a at a high speed. More specifically, the susceptor 16 is rotated such that a moving speed at a position where the moving speed of the substrates 12 is highest while the susceptor 16 is rotating becomes higher than the flow speed of the solution mist 72 discharged from the discharge ports 30a. Rotating the susceptor 16 at a high speed, as such, causes a gas flow that is laminar along the upper surfaces of the substrates 12, and enables the solution mist 72 to flow along the upper surface of each of the substrates 12. This enables a gallium oxide film to be grown uniformly on the upper surface of each of the substrates 12. Moreover, this film formation apparatus enables gallium oxide films to be epitaxially grown simultaneously on the upper surfaces of the plurality of substrates 12.

Fifth Embodiment

Figure 6:
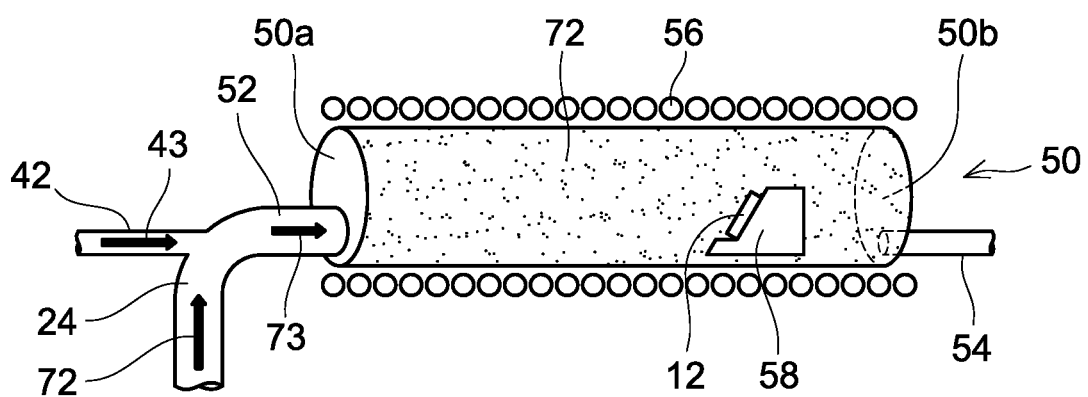
FIG. 6 is an enlarged view of a furnace in a fifth embodiment.

A film formation apparatus in a fifth embodiment, shown in FIG. 6, includes a furnace 50 that houses a substrate 12. A stage 58 is installed in the furnace 50, and allows the substrate 12 to be mounted thereon. A heater 56 configured to heat the substrate 12 is disposed along an outer wall of the furnace 50. The furnace 50 has its upstream end 50a connected to a mixture supply path 52, and has its downstream end 50b connected to a mixture exhaust path 54. The mixture supply path 52 is connected to the heated-gas supply path 42 and the solution mist supply path 24. The heated gas 43 supplied from the heated-gas supply path 42 and the solution mist 72 supplied from the solution mist supply path 24 mix with each other in the mixture supply path 52. The mixture 73 is thereby generated in the mixture supply path 52. The mixture 73 flows from the mixture supply path 52 into the furnace 50, and flows through the furnace 50 from its upstream end 50a to its downstream end 50b. The mixture 73 that has flowed to the downstream end 50b is ejected to the mixture exhaust path 54. A part of the solution mist 72 flowing through the furnace 50 adheres to the upper surface of the substrate 12. As a result, a gallium oxide film is epitaxially grown on the upper surface of the substrate 12. As such, the gallium oxide film may be grown on the upper surface of the substrate 12 by arranging the substrate 12 inside the furnace through which the mixture 73 (i.e., the solution mist 72) flows, without using any nozzle.

Sixth Embodiment

Figure 7:
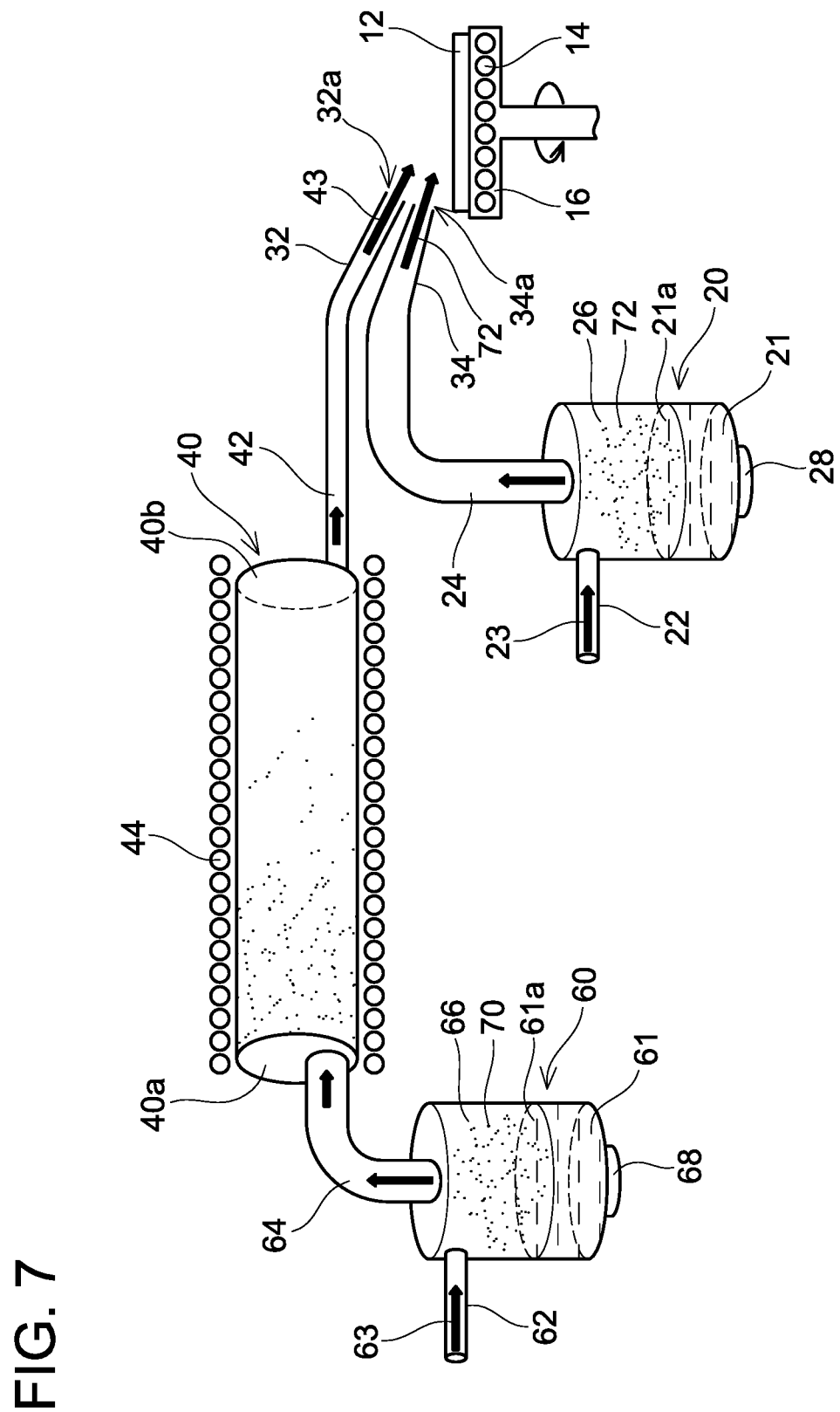
FIG. 7 is a configuration diagram of a film formation apparatus in a sixth embodiment.

A film formation apparatus in a sixth embodiment, shown in FIG. 7, differs from the film formation apparatuses in the first to four embodiments in that the heated gas 43 and the solution mist 72 are discharged from respective separate nozzles toward the upper surface of the substrate 12. That is, the first to four embodiments each adopt a single-flow scheme, whereas the sixth embodiment adopts a double-flow scheme.

As shown in FIG. 7, the film formation apparatus in the sixth embodiment, similarly to the film formation apparatus 10 in the first embodiment, includes the carrier gas supply path 62, the first reservoir 60, the water mist supply path 64, the furnace 40, the heated-gas supply path 42, the carrier gas supply path 22, the second reservoir 20, the solution mist supply path 24, and the susceptor 16. In the sixth embodiment, the downstream end of the heated-gas supply path 42 is connected to a nozzle 32. The heated gas 43 is discharged from the nozzle 32 toward the upper surface of the substrate 12. Moreover, in the sixth embodiment, the downstream end of the solution mist supply path 24 is connected to a nozzle 34. The solution mist 72, together with the carrier gas 23, is discharged from the nozzle 34 toward the upper surface of the substrate 12. The nozzle 34 is located below the nozzle 32.

When the solution mist 72 and the heated gas 43 are discharged toward the upper surface of the substrate 12, a flow of the solution mist 72 and a flow of the heated gas 43 collide with each other on the substrate 12. The solution mist 72 is then heated by the heated gas 43. Water then evaporates from the solution mist 72. However, the heated gas 43 contains water vapor. This suppresses evaporation of water from the solution mist 72. This can raise the temperature of the solution mist 72 while suppressing an increase in concentration of the solution 21, which constitutes each droplet of the solution mist 72. The solution mist 72 adheres to the upper surface of the heated substrate 12. The substrate 12 has a higher temperature than the solution mist 72, due to which a chemical reaction of the solution mist 72 (i.e., the solution 21) occurs on the substrate 12. As a result of this, a gallium oxide film is grown on the upper surface of the substrate 12. Since the solution mist 72 is heated by the heated gas 43, the solution mist 72 is less likely to remove heat from the substrate 12 when adhering to the substrate 12. Accordingly, the substrate 12 can be maintained stably at an appropriate temperature. Moreover, since water is less prone to evaporate from the solution mist 72, the solution 21 of an appropriate concentration can be supplied as the solution mist 72 to the upper surface of the substrate 12. Therefore, a gallium oxide film can be epitaxially grown suitably on the upper surface of the substrate 12.

Figure 8:
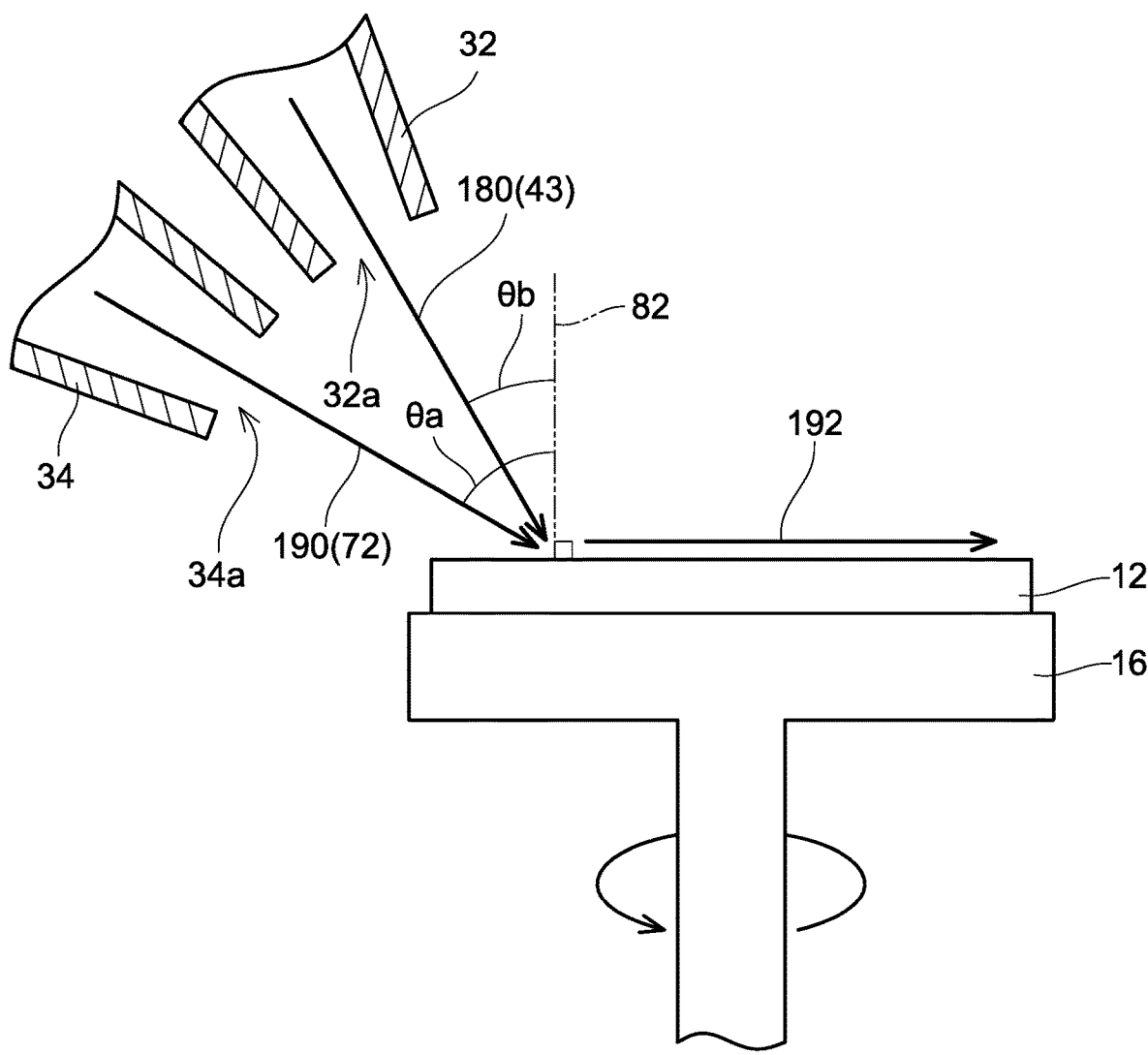
FIG. 8 is an enlarged view of nozzles and a substrate in the sixth embodiment.

FIG. 8 shows an enlarged view of the nozzles 32, 34 and the upper surface of the substrate 12. As shown in FIG. 8, the solution mist 72 is discharged from a discharge port 34a of the nozzle 34 toward the upper surface of the substrate 12. A discharge direction 190 of the solution mist 72 is inclined with respect to the upper surface of the substrate 12. An inclination angle θa of the discharge direction 190 with respect to the upper surface of the substrate 12 is equal to or more than 45 degrees. As shown by an arrow 192, the solution mist 72 thus easily flows along the upper surface of the substrate 12. Therefore, a gallium oxide film can be epitaxially grown uniformly in a wide range of the upper surface of the substrate 12.

As shown in FIG. 8, a discharge port 32a of the nozzle 32 is located above the discharge port 34a of the nozzle 34. The heated gas 43 is discharged from the discharge port 32a of the nozzle 32 toward the upper surface of the substrate 12. A discharge direction 180 of the heated gas 43 is inclined in a same orientation as that of the discharge direction 190 with respect to the upper surface of the substrate 12. That is, the discharge direction 180 is inclined to a discharge direction 190 side from the perpendicular line 82. An inclination angle θb of the discharge direction 180 with respect to the upper surface of the substrate 12 is smaller than the inclination angle θa. The inclination angle θb is less than 45 degrees. Thus, when the heated gas 43 is discharged along the discharge direction 180, the flow of the heated gas 43 presses the flow of the solution mist 72 shown by the arrows 190, 192 from above toward the upper surface of the substrate 12. Therefore, the solution mist 72 easily adheres to the upper surface of the substrate 12, and a gallium oxide film can be epitaxially grown more suitably on the upper surface of the substrate 12.

Moreover, in the sixth embodiment as well, the susceptor 16 rotates the substrate 12 about its central axis at a low speed. Therefore, a gallium oxide film can be epitaxially grown uniformly on the entirety of the upper surface of the substrate 12.

Seventh Embodiment

Figure 9:
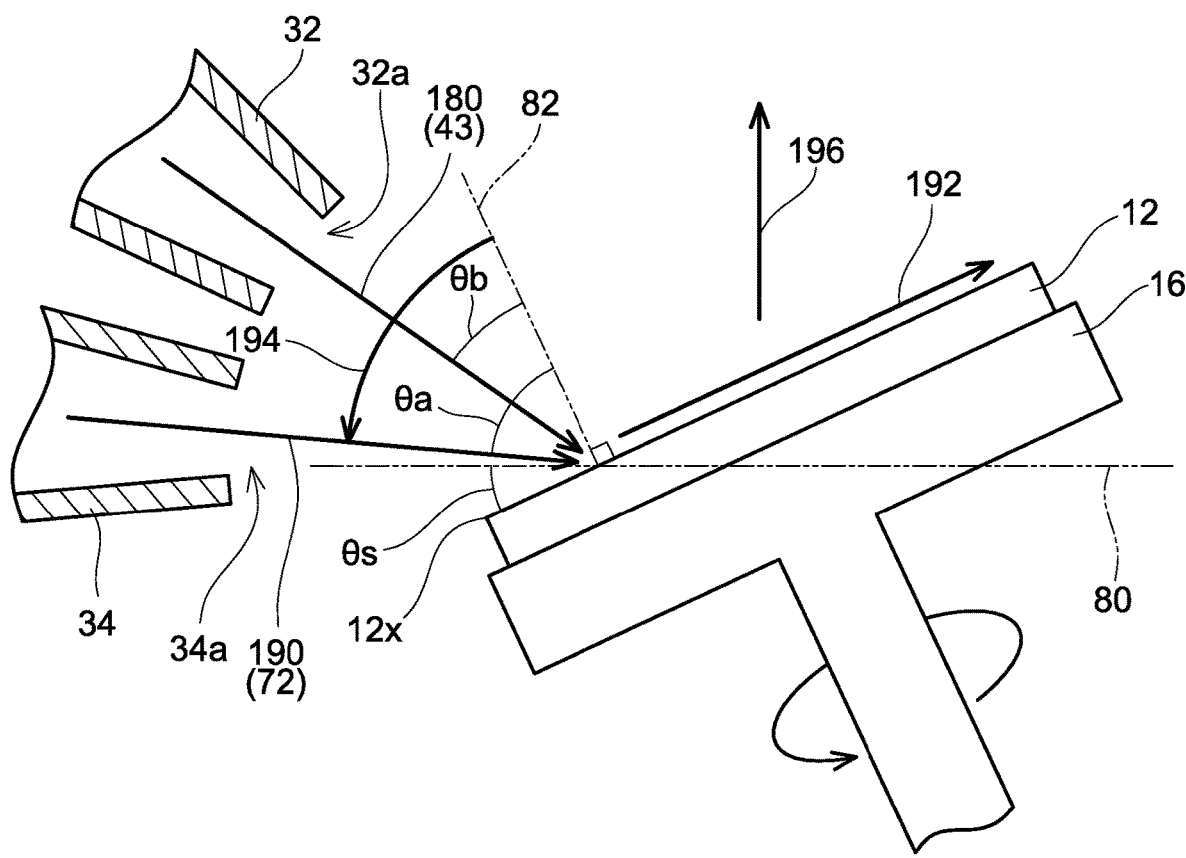
FIG. 9 is an enlarged view of nozzles and a substrate in a seventh embodiment.

A film formation apparatus in a seventh embodiment, shown in FIG. 9, differs from that in the sixth embodiment in how each of the susceptor 16 and the nozzles 32, 34 is positioned. Other configurations of the film formation apparatus in the seventh embodiment are equal to those in the sixth embodiment. In the seventh embodiment, the susceptor 16 is located to be inclined with respect to the horizontal plane 80. Accordingly, the upper surface of the substrate 12 mounted on the susceptor 16 is also inclined with respect to the horizontal plane 80. In FIG. 9, the inclination angle θs shows an inclination angle of the upper surface of the substrate 12 with respect to the horizontal plane 80 (i.e., an angle between the upper surface of the substrate 12 and the horizontal plane 80). Moreover, as shown by an arrow 194, the discharge direction 190 of the solution mist 72 is inclined to the lower edge 12x side of the upper surface of the substrate 12 from the perpendicular line 82 standing on the upper surface of the substrate 12. The inclination angle θa of the discharge direction 190 with respect to the upper surface of the substrate 12 is equal to or more than 45 degrees. The sum of the inclination angle θa and the inclination angle θs is less than 90 degrees. The discharge direction 180 is inclined in a same orientation as that of the discharge direction 190 with respect to the upper surface of the substrate 12. The inclination angle θb of the discharge direction 180 with respect to the upper surface of the substrate 12 is less than 45 degrees. The discharge port 32a is located above the discharge port 34a.

In the seventh embodiment as well, similarly to the sixth embodiment, the flow of the solution mist 72 is pressed by the flow of the heated gas 43 onto the upper surface of the substrate 12, by which a gallium oxide film can be epitaxially grown suitably on the upper surface of the substrate 12.

Moreover, inclining the upper surface of the substrate 12 with respect to the horizontal plane 80, as in the seventh embodiment, increases an angle between a traveling direction of the water vapor that evaporates at the upper surface of the substrate 12 (an arrow 196) and each of the discharge directions 190, 180, and thus each of the flows of the solution mist 72 and the heated gas 43 (i.e., the discharge directions 190, 180) and the flow of water vapor (i.e., the arrow 196) are less likely to interfere with each other. Therefore, as shown by the arrow 192, the solution mist 72 further easily flows along the upper surface of the substrate 12, and a gallium oxide film can be grown more suitably on the upper surface of the substrate 12.

Eighth Embodiment

Figure 10:
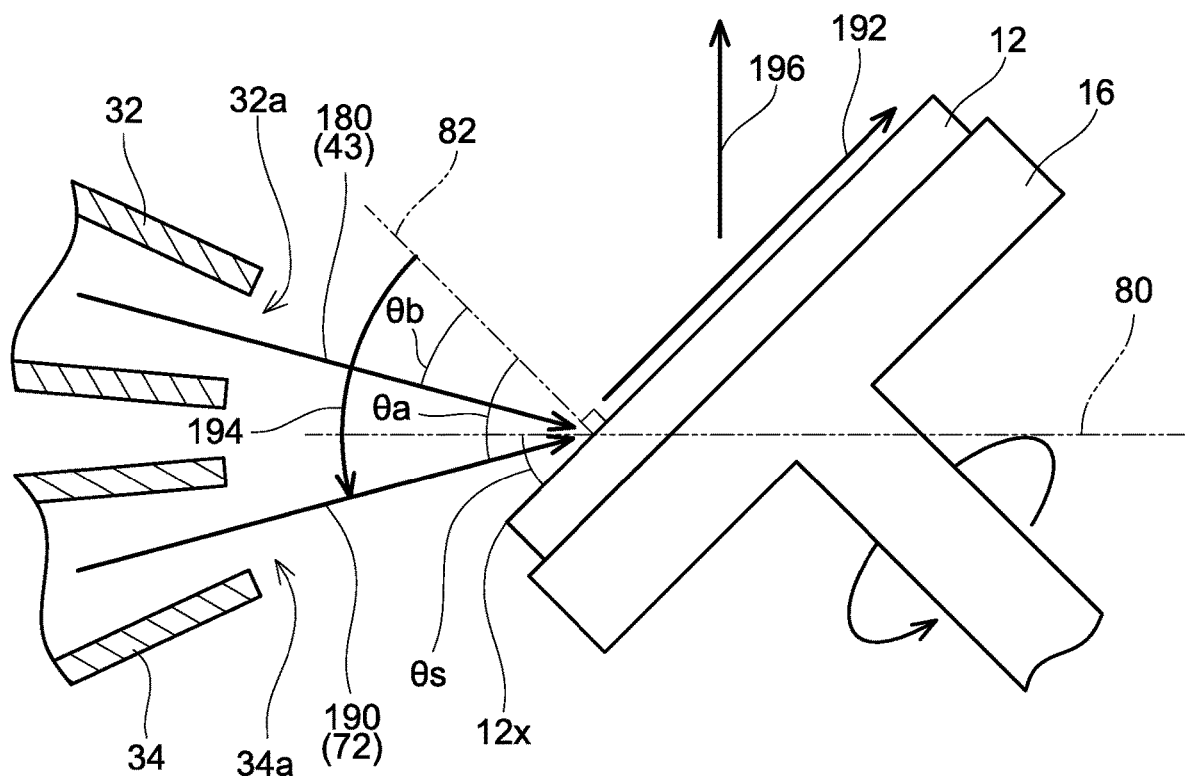
FIG. 10 is an enlarged view of nozzles and a substrate in an eighth embodiment.

A film formation apparatus in an eighth embodiment, shown in FIG. 10, differs from that in the seventh embodiment about respective angles of the nozzles 32, 34 and the susceptor 16. Other configurations of the film formation apparatus in the eighth embodiment are equal to those in the seventh embodiment. In the eighth embodiment, the inclination angle θs of the susceptor 16 is larger than that in the seventh embodiment. In the eighth embodiment, similarly to the seventh embodiment, the discharge direction 190 is inclined, as shown by the arrow 194, to the lower edge 12x side of the upper surface of the substrate 12 from the perpendicular line 82 standing on the upper surface of the substrate 12. The inclination angle θa of the discharge direction 190 with respect to the upper surface of the substrate 12 is equal to or more than 45 degrees. Moreover, the inclination angle θb of the discharge direction 180 with respect to the upper surface of the substrate 12 is less than 45 degrees. In the eighth embodiment, the sum of the inclination angle θa and the inclination angle θs is equal to or more than 90 degrees. Due to this, in the eighth embodiment, the discharge direction 190 is oriented diagonally upward. This configuration further increases the angle between the discharge direction 190 and the traveling direction of the water vapor shown by the arrow 196 than that in the seventh embodiment (FIG. 9), and thus the flow of the solution mist 72 (i.e., the discharge direction 190) and the flow of water vapor (i.e., the arrow 196) are much less likely to interfere with each other. Therefore, as shown by the arrow 192, the solution mist 72 further easily flows along the upper surface of the substrate 12, and a gallium oxide film can be grown further suitably on the upper surface of the substrate 12.

In the above-mentioned sixth to eighth embodiments, the substrate 12 (i.e., the susceptor 16) may not be rotated.

Alternatively, the substrate 12 may be rotated at a high speed such that the moving speed at a position where a moving speed of the substrate 12 is highest (e.g., the peripheral edge of the substrate 12) becomes higher than the flow speed of the solution mist 72 discharged from the discharge port 34a. Rotating the substrate 12 at a high speed causes a gas flow that is laminar along the upper surface of the substrate 12, and enables the solution mist 72 to flow along the laminar flow. This enables a gallium oxide film to be grown uniformly on the upper surface of the substrate 12.

Ninth Embodiment

Figure 11:
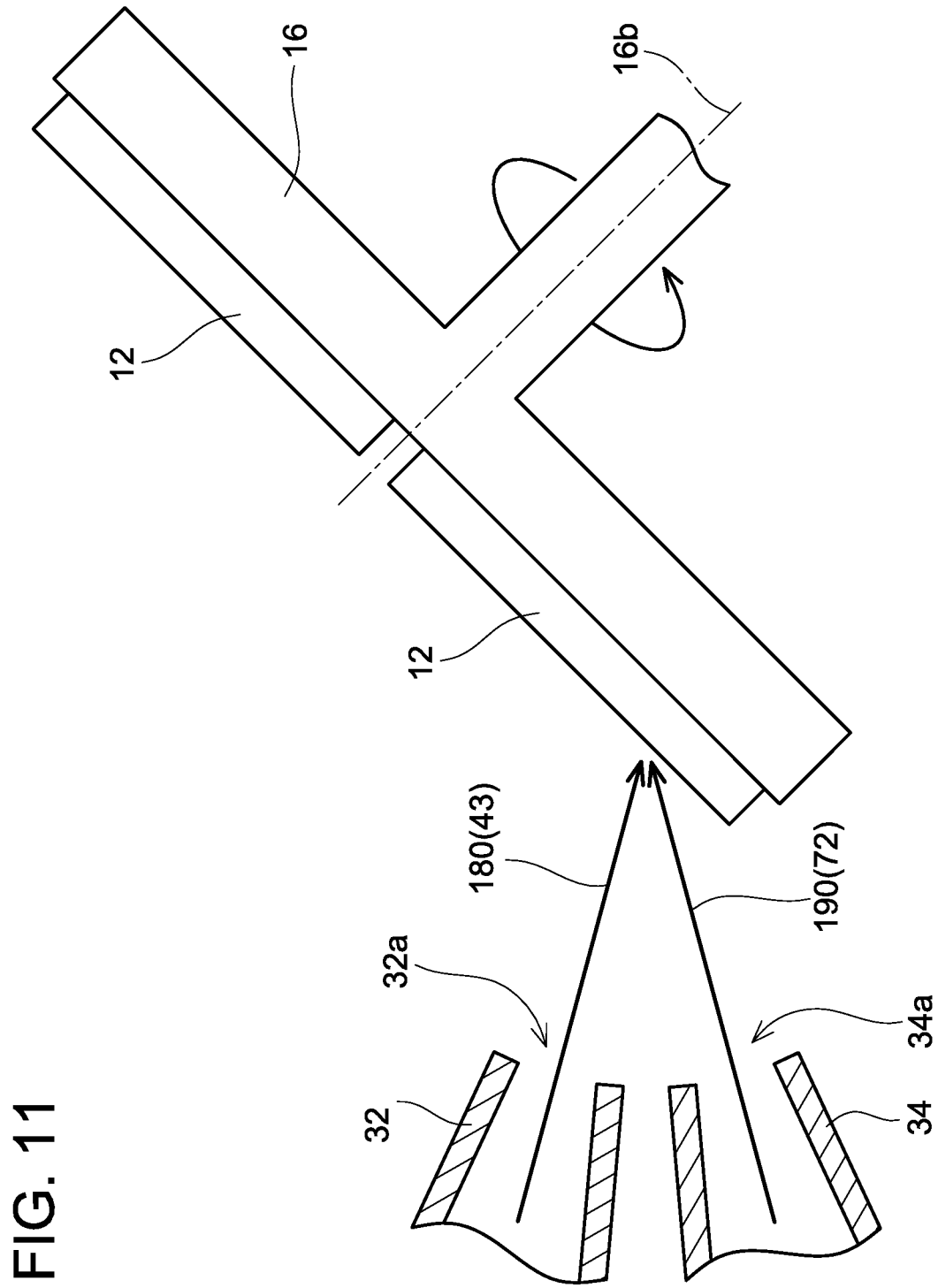
FIG. 11 is an enlarged view of nozzles and substrates in a ninth embodiment.

A film formation apparatus in a ninth embodiment, shown in FIG. 11, includes a susceptor 16 that allows a plurality of substrates 12 to be mounted thereon. The plurality of substrates 12 is distributed around a central axis 16b of the susceptor 16. Nozzles 32, 34 are arranged so as to discharge the heated gas 43 and the solution mist 72 to the upper surface of the substrate 12 located below the central axis 16b. The susceptor 16 rotates about the central axis 16b at a low speed. The heated gas 43 and the solution mist 72 that are discharged from the nozzles 32, 34 are then supplied to the upper surfaces of the plurality of substrates 12. The film formation apparatus in the ninth embodiment enables gallium oxide films to be epitaxially grown simultaneously on the respective upper surfaces of the plurality of substrates 12. In the ninth embodiment, the susceptor 16 may be rotated at a high speed such that a moving speed at a position where a moving speed of the respective substrates 12 is highest becomes higher than the flow speed of the solution mist 72 discharged from the discharge port 34a.

Although the susceptor 16 is rotated in the above-mentioned first to four and sixth to ninth embodiments, the nozzles 30, 32, 34 may be rotated in place of or in addition to the susceptor 16, to thereby allow the solution mist 72 to impinge on the entireti(es) of the upper surface(s) of the substrate(s) 12.

Although each of the first to ninth embodiments mentioned above adopts water as the solvent of the solution 21, a liquid other than water may be implemented as the solvent.

A relation between features of the above-mentioned embodiments and features in the claims will be described. The susceptor 16 in the embodiments is an example of a stage in the claims. The second reservoir 20 in the embodiments is an example of a mist supply source in the claims. The furnace 40 in the embodiments is an example of a heated-gas supply source in the claims. Each of the nozzles 30, 32, 34, and the mixture supply path 52 in the embodiments is an example of a delivery device in the claims. Each of the nozzle 30 and the mixture supply path 52 in the embodiments is an example of a mixture path in the claims. The nozzle 34 in the embodiments is an example of a first path in the claims. The nozzle 32 in the embodiments is an example of a second path in the claims.

Some of the technical features disclosed in the present description will herein be listed. It should be noted that the respective technical features are independently useful.

In an example of a film formation apparatus disclosed herein, the solvent may be $H_2O$ (water). In this case, gas (gas contained in the heated gas) of a same material as the solvent is water vapor.

In an example of the film formation apparatus disclosed herein, the delivery device may comprise a mixture passage, and a mixture of the mist and the heated gas may be delivered to the surface of the substrate through the mixture passage.

Mixing the mist and the heated gas and delivering the mixture to the surface of the substrate, as such, enable a film to be epitaxially grown on the surface of the substrate.

In an example of the film formation apparatus disclosed herein, a discharge direction along which the mixture passage discharges the mixture to the surface of the substrate may be inclined with respect to the surface of the substrate.

The mixture is usually discharged spreading to a certain degree. In this case, the above-described discharge direction means a mean discharge direction of the discharged mixture. The same applies to a first discharge direction and a second discharge direction mentioned below.

Such an inclination of the discharge direction of the mixture with respect to the surface of the substrate facilitates the mixture to flow along the surface of the substrate, and hence enables a film to be epitaxially grown more suitably.

In an example of the film formation apparatus disclosed herein, the surface of the substrate may be an upper surface of the substrate. The upper surface of the substrate may be inclined with respect to a horizontal plane. The discharge direction may be inclined to a lower edge side of the upper surface of the substrate from a perpendicular line standing on the upper surface.

Figure 12:
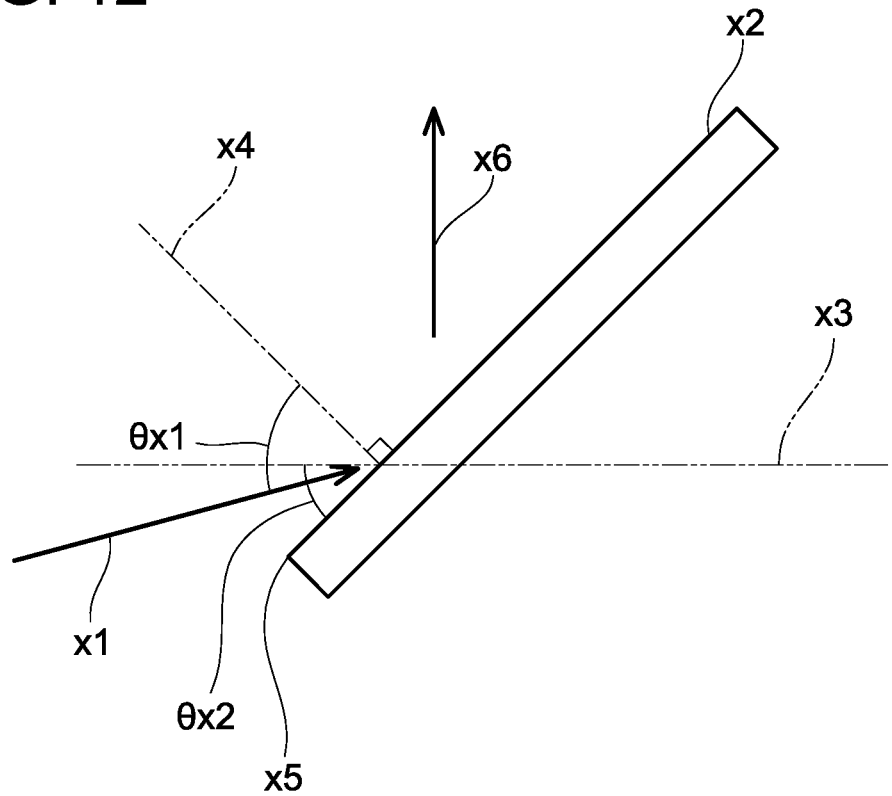
FIG. 12 is an explanatory diagram of a film formation apparatus in an example.

FIG. 12 shows an example of this configuration. In FIG. 12, an arrow X1 is the discharge direction of the mixture. In FIG. 12, an upper surface X2 of the substrate is inclined with respect to a horizontal plane X3. Moreover, the discharge direction X1 is inclined to a lower edge X5 side of the upper surface X2 of the substrate from a perpendicular line X4 standing on the upper surface X2 of the substrate. When the mist adheres to the upper surface X2 of the substrate, the solvent evaporates from the mist. The solvent that evaporates travels upward as shown by an arrow X6. Inclining the discharge direction X1 with respect to the upper surface X2 of the substrate, as described above, increases the angle between a traveling direction X6 of the solvent that evaporates and the discharge direction X1 of the mixture, so that the solvent that evaporates and the discharged mixture are less likely to interfere with each other. Therefore, a film can be epitaxially grown stably.

In the film formation apparatus in which the upper surface of the substrate is inclined with respect to the horizontal plane, a sum of an inclination angle of the discharge direction of the mixture with respect to the upper surface of the substrate and an inclination angle of the upper surface of the substrate with respect to the horizontal plane may be more than 90 degrees.

The inclination angle of the discharge direction with respect to the upper surface of the substrate means an angle between the discharge direction and the perpendicular line standing on the upper surface of the substrate. For example, in FIG. 12, the inclination angle of the discharge direction X1 with respect to the upper surface X2 is an angle θx1. The same applies to an inclination angle of each of the first discharge direction and the second discharge direction mentioned below. Moreover, an inclination angle of the upper surface of the substrate with respect to the horizontal plane means an angle between the upper surface of the substrate and the horizontal plane. For example, in FIG. 12, an angle of the upper surface X2 of the substrate with respect to the horizontal plane X3 is an angle θx2.

FIG. 12 shows an example of this configuration. As shown in FIG. 12, allowing the sum of the inclination angle θx1 of the discharge direction X1 with respect to the upper surface X2 and the inclination angle θx2 of the upper surface X2 with respect to the horizontal plane X3 to be equal to or more than 90 degrees causes the discharge direction X1 to be oriented diagonally upward. Thus, the angle between the traveling direction X6 of the solvent that has evaporated at the upper surface X2 of the substrate and the discharge direction X1 is thus more increased. The solvent that evaporates and the discharged mixture are thus much less likely to interfere with each other. Therefore, a film can be epitaxially grown more stably.

In an example of the film formation apparatus disclosed herein, an inclination angle of the discharge direction of the mixture with respect to the surface of the substrate may be equal to or more than 45 degrees.

For example, the inclination angle θx1 in FIG. 12 can be made equal to or more than 45 degrees. Such an increase of the inclination angle of the discharge direction of the mixture facilitates the mixture to flow easily along the surface of the substrate, so that a film can be epitaxially grown more suitably.

In an example of the film formation apparatus disclosed herein, the delivery device may comprise a first path and a second path being separate from the first path. The mist may be delivered to the surface of the substrate through the first path, and the heated gas may be delivered to the surface of the substrate through the second path.

Delivering the mist and the heated gas from separate paths to the surface of the substrate as such also can allow to heat the mist by the heated gas. This configuration also enables a film to be epitaxially grown suitably on the surface of the substrate.

In an example of the film formation apparatus disclosed herein, a first discharge direction along which the first path discharges the mist toward the surface of the substrate may be inclined with respect to the surface of the substrate.

Such an inclination of the first discharge direction with respect to the surface of the substrate facilitates the mist to flow easily along the surface of the substrate, by which a film can be epitaxially grown more suitably.

In an example of the film formation apparatus disclosed herein, a traveling path of the mist discharged from the first path toward the surface of the substrate may be located between the surface of the substrate and a traveling path of the heated gas discharged from the second path toward the surface of the substrate.

Figure 13:
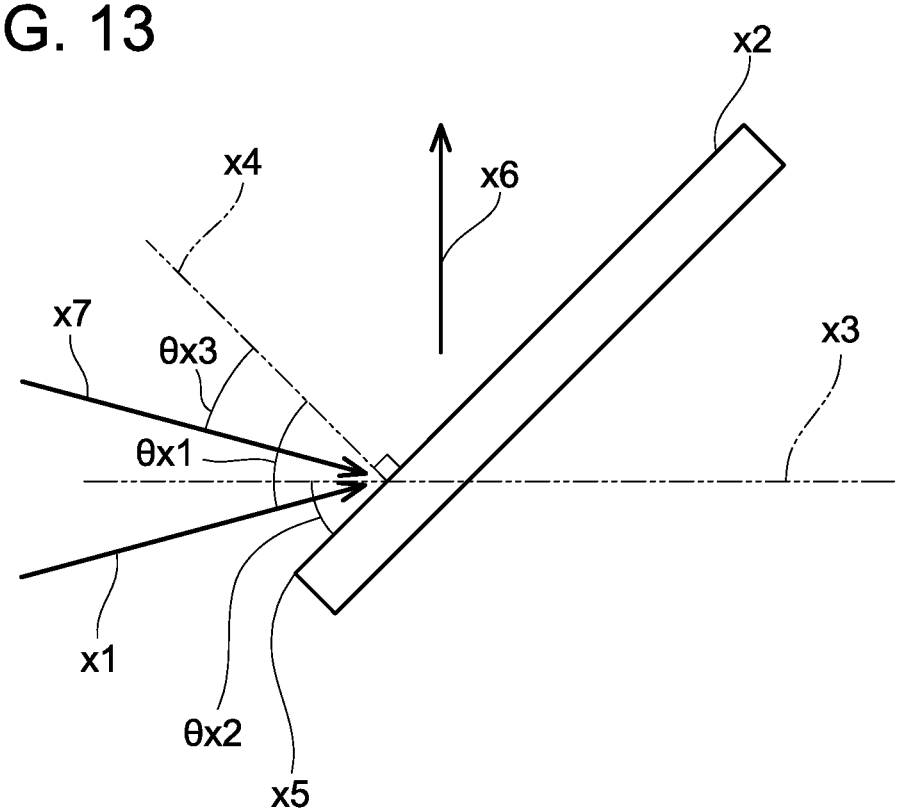
FIG. 13 is an explanatory diagram of a film formation apparatus in another example.

FIG. 13 shows an example of this configuration. Reference signs X1 to X6, θx1, and θx2 in FIG. 13 respectively show the same components as those in FIG. 12. In FIG. 13, an arrow X7 shows a traveling path of the heated gas discharged from the second path toward the surface X2 of the substrate. Positioning the traveling path X1 of the mist between the traveling path X7 of the heated gas and the surface X2 of the substrate as in FIG. 13 allows the mist to be pressed by the heated gas toward the surface X2 of the substrate, as a result of which the mist easily adheres to the surface X2 of the substrate. Therefore, a film can be epitaxially grown more suitably.

In an example of the film formation apparatus disclosed herein, the surface of the substrate may be an upper surface of the substrate. A second discharge port from which the second path discharges the heated gas toward the upper surface of the substrate may be located above a first discharge port from which the first path discharges the mist toward the upper surface of the substrate. A second discharge direction along which the second path discharges the heated gas toward the upper surface of the substrate and the first discharge direction along which the first path discharges the mist to the upper surface of the substrate may be inclined to a same side with respect to the upper surface of the substrate. An inclination angle of the first discharge direction with respect to the upper surface of the substrate may be larger than an inclination angle of the second discharge direction with respect to the upper surface of the substrate.

FIG. 13 shows an example of this configuration. In FIG. 13, the second discharge direction X7 and the first discharge direction X1 may be inclined to a same side with respect to the upper surface X2 of the substrate. Moreover, the inclination angle θx1 of the first discharge direction X1 with respect to the upper surface X2 of the substrate is larger than an inclination angle θx3 of the second discharge direction X7 with respect to the upper surface X2 of the substrate. This configuration allows the mist to be pressed by the heated gas toward the upper surface X2 of the substrate, as a result of which the mist easily adheres to the upper surface X2 of the substrate. Therefore, a film can be epitaxially grown more suitably.

In an example of the film formation apparatus disclosed herein, the upper surface of the substrate may be inclined with respect to a horizontal plane. The first discharge direction may be inclined to a lower edge side of the upper surface of the substrate from a perpendicular line standing on the upper surface of the substrate.

FIG. 13 shows an example of this configuration. This configuration makes the solvent (the arrow X6) that evaporates at the upper surface X2 of the substrate and the mist (the arrow X1) discharged along the first discharge direction much less likely to interfere with each other. Therefore, a film can be epitaxially grown more stably.

In an example of the film formation apparatus disclosed herein, a sum of an inclination angle of the first discharge direction with respect to the upper surface of the substrate and an inclination angle of the upper surface of the substrate with respect to the horizontal plane may be more than 90 degrees.

FIG. 13 shows an example of this configuration. As shown in FIG. 13, allowing the sum of the inclination angle θx1 of the discharge direction X1 with respect to the upper surface X2 and the inclination angle θx2 of the upper surface X2 with respect to the horizontal plane X3 to be equal to or more than 90 degrees causes the discharge direction X1 to be oriented diagonally upward. This further increases the angle between the traveling direction X6 of the solvent that evaporates at the upper surface X2 of the substrate and the discharge direction X1. This makes the solvent that evaporates and the discharged mixture less likely to interfere with each other. Therefore, a film can be epitaxially grown more stably.

In an example of the film formation apparatus disclosed herein, the inclination angle of the first discharge direction with respect to the upper surface of the substrate may be equal to or more than 45 degrees. The inclination angle of the second discharge direction with respect to the upper surface of the substrate may be less than 45 degrees.

In FIG. 13, the angle θx1 is an inclination angle of the first discharge direction X1 with respect to the upper surface X2 of the substrate, and the angle θx3 is an inclination angle of the second discharge direction X7 with respect to the upper surface X2 of the substrate. Such an increase of the inclination angle of the first discharge direction facilitates the mist to easily flow along the surface of the substrate, by which a film can be epitaxially grown more suitably. Moreover, increasing the inclination angle of the second discharge direction allows the mist to easily adhere to the surface of the substrate. Therefore, a film can be epitaxially grown more suitably.

In an example of the film formation apparatus disclosed herein, the substrate and a discharge port for the mist may be configured rotatable relatively to each other. A relative moving speed at a position where a relative moving speed between the substrate and the discharge port is highest while the substrate and the discharge port are relatively rotating may be lower than a flow speed of the mist discharged from the discharge port toward the surface of the substrate.

Note that "the substrate and a discharge port for the mist are configured rotatable relatively to each other" means that: either the substrate only may be rotatable or the discharge port only may be rotatable; or both of them may be rotatable.

Allowing the substrate and the discharge port for the mist to be rotatable relatively to each other, as such, enables a film to be epitaxially grown in a wide range of the surface of the substrate. Moreover, setting the rotation speed of the relative rotation to be low, as such, reduces an influence of an airflow generated by the rotation, by which a film can be epitaxially grown uniformly on the surface of the substrate.

In an example of the film formation apparatus disclosed herein, the substrate may be rotatable. A moving speed at a position where a moving speed of the substrate is highest while the substrate is rotating may be higher than a flow speed of the mist discharged from the discharge port toward the surface of the substrate.

Rotating the substrate, as such, enables a film to be epitaxially grown in a wide range of the surface of the substrate. Moreover, setting the rotation speed of the substrate to be high, as such, allows a laminar flow to be generated near the surface of the rotating substrate, by which a film can be epitaxially grown uniformly on the surface of the substrate.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:
1. A film formation apparatus comprising:
a stage configured to allow a substrate to be mounted thereon;
a heater configured to heat the substrate;
a mist supply source configured to supply mist of a solution that comprises solvent and a material of a film dissolved in the solvent;
a heated-gas supply source configured to supply heated gas that comprises gas constituted of a same material as a material of the solvent and has a higher temperature than the mist; and
a delivery device configured to deliver the mist and the heated gas toward a surface of the substrate, the mist and the heated gas delivered by the delivery device being provided to the surface of the substrate so that the film is epitaxially grown on the surface of the substrate, wherein
the delivery device comprises a first path and a second path provided separately from the first path,
the mist is delivered to the surface of the substrate through the first path, and
the heated gas is delivered to the surface of the substrate through the second path.

2. The film formation apparatus of claim 1, wherein the solvent is H2O.

3. The film formation apparatus of claim 1, wherein a first discharge direction along which the first path discharges the mist toward the surface of the substrate is inclined with respect to the surface of the substrate.

4. The film formation apparatus of claim 1, wherein a traveling path of the mist discharged from the first path toward the surface of the substrate is located between the surface of the substrate and a traveling path of the heated gas discharged from the second path to the surface of the substrate.

5. The film formation apparatus of claim 3, wherein
the surface of the substrate is an upper surface of the substrate,
a second discharge port from which the second path discharges the heated gas toward the upper surface of the substrate is located above a first discharge port from which the first path discharges the mist toward the upper surface of the substrate,
a second discharge direction along which the second path discharges the heated gas toward the upper surface of the substrate and the first discharge direction along which the first path discharges the mist toward the upper surface of the substrate are inclined to a same side with respect to the upper surface of the substrate, and
an inclination angle of the first discharge direction with respect to the upper surface of the substrate is larger than an inclination angle of the second discharge direction with respect to the upper surface of the substrate.

6. The film formation apparatus of claim 5, wherein
the upper surface of the substrate is inclined with respect to a horizontal plane,
the first discharge direction is inclined to a lower edge side of the upper surface of the substrate from a perpendicular line standing on the upper surface of the substrate.

7. The film formation apparatus of claim 6, wherein a sum of an inclination angle of the first discharge direction with respect to the upper surface of the substrate and an inclination angle of the upper surface of the substrate with respect to the horizontal plane is more than 90 degrees.

8. The film formation apparatus of claim 5, wherein
the inclination angle of the first discharge direction with respect to the upper surface of the substrate is equal to or more than 45 degrees, and
the inclination angle of the second discharge direction with respect to the upper surface of the substrate is less than 45 degrees.

9. The film formation apparatus of claim 1, wherein
the substrate and a discharge port for the mist are configured rotatable relatively to each other, and
a relative moving speed at a position where a relative moving speed between the substrate and the discharge port is highest while the substrate and the discharge port are rotating relatively to each other is lower than a flow speed of the mist discharged from the discharge port toward the surface of the substrate.

10. The film formation apparatus of claim 1, wherein
the substrate is rotatable, and
a moving speed at a position where a moving speed of the substrate is highest while the substrate is rotating is higher than a flow speed of the mist discharged from the discharge port toward the surface of the substrate.

11. A method of manufacturing a semiconductor device using a film formation apparatus, wherein the film formation apparatus comprises:
- a stage configured to allow a substrate to be mounted thereon;
- a heater configured to heat the substrate;
- a mist supply source configured to supply mist of a solution comprising solvent and a material of a film dissolved in the solvent;
- a heated-gas supply source configured to supply heated gas that comprises gas constituted of a same material as a material of the solvent and has a higher temperature than the mist; and
- a delivery device configured to deliver the mist and the heated gas toward a surface of the substrate, the method comprising delivering the mist and the heated gas from the delivery device to the surface of the substrate so that the film is epitaxially grown on the surface of the substrate, wherein the delivery device comprises a first path and a second path provided separately from the first path, and during delivery of the mist and the heated gas from the delivery device to the surface of the substrate, the mist is delivered to the surface of the substrate through the first path, and the heated gas is delivered to the surface of the substrate through the second path.

* * * * *